US008671320B2

(12) United States Patent
Tekumalla

(10) Patent No.: US 8,671,320 B2
(45) Date of Patent: Mar. 11, 2014

(54) INTEGRATED CIRCUIT COMPRISING SCAN TEST CIRCUITRY WITH CONTROLLABLE NUMBER OF CAPTURE PULSES

(75) Inventor: Ramesh C. Tekumalla, Breinigsville, PA (US)

(73) Assignee: LSI Corporation, San Jose, CA (US)

( * ) Notice: Subject to any disclaimer, the term of this patent is extended or adjusted under 35 U.S.C. 154(b) by 261 days.

(21) Appl. No.: 13/165,284

(22) Filed: Jun. 21, 2011

(65) Prior Publication Data
US 2012/0331362 A1   Dec. 27, 2012

(51) Int. Cl.
*G01R 31/28* (2006.01)
(52) U.S. Cl.
USPC .......................................... 714/731
(58) Field of Classification Search
USPC .......... 714/731, 724, 726, 744; 713/400, 500; 327/141; 326/93
See application file for complete search history.

(56) References Cited

U.S. PATENT DOCUMENTS

| | | | |
|---|---|---|---|
| 6,430,720 B1 * | 8/2002 | Frey et al. ..................... | 714/744 |
| 6,640,324 B1 | 10/2003 | Goldovsky | |
| 6,886,145 B2 | 4/2005 | Davidson et al. | |
| 7,010,732 B2 * | 3/2006 | Firth et al. ..................... | 714/718 |
| 7,340,658 B2 * | 3/2008 | Seuring ......................... | 714/726 |
| 7,444,567 B2 * | 10/2008 | Wang et al. .................... | 714/726 |
| 7,456,674 B2 * | 11/2008 | Oakland ........................ | 327/291 |
| 7,487,419 B2 * | 2/2009 | Mukherjee et al. ........... | 714/729 |
| 7,779,316 B2 | 8/2010 | Parulkar et al. | |
| 7,831,876 B2 | 11/2010 | Goyal et al. | |
| 7,836,370 B2 * | 11/2010 | Satoi et al. .................... | 714/731 |
| 2002/0138801 A1 * | 9/2002 | Wang et al. .................... | 714/729 |
| 2002/0138802 A1 * | 9/2002 | Firth et al. ..................... | 714/733 |
| 2003/0037296 A1 | 2/2003 | Yoshimoto | |
| 2004/0190331 A1 * | 9/2004 | Ross et al. ..................... | 365/154 |
| 2008/0004831 A1 | 1/2008 | Li | |
| 2008/0022176 A1 * | 1/2008 | Anzou et al. .................. | 714/733 |
| 2008/0126897 A1 | 5/2008 | Pandey | |
| 2009/0235132 A1 | 9/2009 | Wang et al. | |
| 2010/0218060 A1 | 8/2010 | Nakako | |

FOREIGN PATENT DOCUMENTS

| | | |
|---|---|---|
| CA | 2307535 A1 | 11/2000 |
| WO | 2004074852 A2 | 9/2004 |

* cited by examiner

*Primary Examiner* — Albert Decady
*Assistant Examiner* — Osman Alshack
(74) *Attorney, Agent, or Firm* — Ryan, Mason & Lewis, LLP

(57) ABSTRACT

An integrated circuit comprises scan test circuitry and additional circuitry subject to testing utilizing the scan test circuitry. The scan test circuitry comprises a plurality of scan chains coupled to the additional circuitry, a scan capture clock generator configured to generate a scan capture clock signal having a controllable number of capture pulses, and a clock selection circuit configured to select between at least the scan capture clock signal and a scan shift clock signal for application to clock signal inputs of the scan chains. In one embodiment, the scan capture clock generator comprises a finite state machine, a plurality of capture clock pulse circuits each generating a capture clock pulse signal comprising a different number of capture clock pulses, and logic circuitry coupled to the finite state machine and having inputs adapted to receive the outputs of the capture clock pulse circuits. The logic circuitry is configured to provide at an output thereof at least a portion of a particular one of the capture clock pulse signals based on a current state of the finite state machine.

20 Claims, 4 Drawing Sheets

INTEGRATED CIRCUIT COMPRISING SCAN TEST CIRCUITRY WITH CONTROLLABLE NUMBER OF CAPTURE PULSES

FIELD OF THE INVENTION

The present invention relates generally to integrated circuit testing, and more particularly to integrated circuit testing using scan test circuitry.

BACKGROUND OF THE INVENTION

Integrated circuits are often designed to incorporate scan test circuitry that facilitates testing for various internal fault conditions. Such scan test circuitry typically comprises scan chains, which are chains of flip-flops that are used to form serial shift registers for applying test patterns at inputs to combinational logic of the integrated circuit and for reading out the corresponding results.

As integrated circuits have become increasingly complex, scan compression techniques have been developed which reduce the number of test patterns that need to be applied when testing a given integrated circuit, and therefore also reduce the required test time. However, the use of high levels of scan compression can adversely impact diagnostic resolution, that is, the ability to attribute a particular failure to an exact fault or set of faults within the combinational logic. As a result, when using scan compression, a tradeoff exists between compression level and diagnostic resolution. Additional details regarding compressed scan testing are disclosed in U.S. Pat. No. 7,831,876, entitled "Testing a Circuit with Compressed Scan Subsets," which is commonly assigned herewith and incorporated by reference herein.

It is also well known to provide an integrated circuit with built-in self-test (BIST) functionality so as to allow that integrated circuit to test its internal combinational logic without the need for an external test system. For example, integrated circuits comprising embedded memories are often configured to include memory BIST (MBIST) circuitry for testing the operation of the memory cells within a memory array.

A significant problem with existing techniques for MBIST testing of embedded memory in an integrated circuit is that there is typically certain sequential logic or other functional logic at the input or output of the memory that is not covered by the MBIST testing. For example, during MBIST testing the functional address and data paths going into the embedded memory are usually bypassed and an MBIST controller instead provides the address and data inputs for the memory array being tested, which unfortunately provides no test coverage for the functional address and data paths. It should be noted that this problem is not limited to integrated circuits that include embedded memory and utilize MBIST. Similar test coverage problems can arise in other types of integrated circuits.

SUMMARY OF THE INVENTION

Illustrative embodiments of the invention provide improved circuitry and techniques for scan testing of integrated circuits. For example, in one or more such embodiments, an integrated circuit comprises an embedded memory and an associated MBIST controller, and is further configured to include scan test circuitry that generates a scan capture clock in which the number of capture pulses can be controlled in real time based on test patterns being applied to scan chains of the integrated circuit. The variable number of capture pulses facilitates testing of sequential logic or other functional logic that is not covered by the MBIST testing functionality of the integrated circuit, such as functional address and data paths of the embedded memory that are bypassed during MBIST testing.

In one aspect, an integrated circuit comprises scan test circuitry and additional circuitry subject to testing utilizing the scan test circuitry. The scan test circuitry comprises a plurality of scan chains coupled to the additional circuitry, a scan capture clock generator configured to generate a scan capture clock signal having a controllable number of capture pulses, and a clock selection circuit configured to select between at least the scan capture clock signal and a scan shift clock signal for application to clock signal inputs of the scan chains.

By way of example, the scan capture clock generator may comprise a finite state machine, a plurality of capture clock pulse circuits each generating a capture clock pulse signal comprising a different number of capture clock pulses, and logic circuitry coupled to the finite state machine and having inputs adapted to receive the outputs of the capture clock pulse circuits, with the logic circuitry being configured to provide at an output thereof at least a portion of a particular one of the capture clock pulse signals based on a current state of the finite state machine.

The illustrative embodiments provide considerable advantages over conventional arrangements. For example, a given such embodiment can provide a variable number of capture pulses for supporting at-speed scan testing of functional paths through an embedded memory that are bypassed during conventional MBIST testing of the embedded memory. The number of capture pulses generated can be varied in real time based on each test pattern to be applied during the at-speed scan testing.

DETAILED DESCRIPTION OF THE INVENTION

The invention will be illustrated herein in conjunction with exemplary integrated circuits comprising scan test circuitry for supporting scan testing of other internal circuitry of those integrated circuits. It should be understood, however, that the invention is more generally applicable to any integrated circuit in which it is desirable to provide improved testing of functional logic associated with an embedded memory or other internal circuitry of the integrated circuit. For example, the disclosed techniques can be adapted for application to testing of integrated circuits that comprise stand-alone memory devices, such as RAM, ROM or Flash memory integrated circuits, which may additionally or alternatively include multi-level memory integrated circuits.

Figure 1:
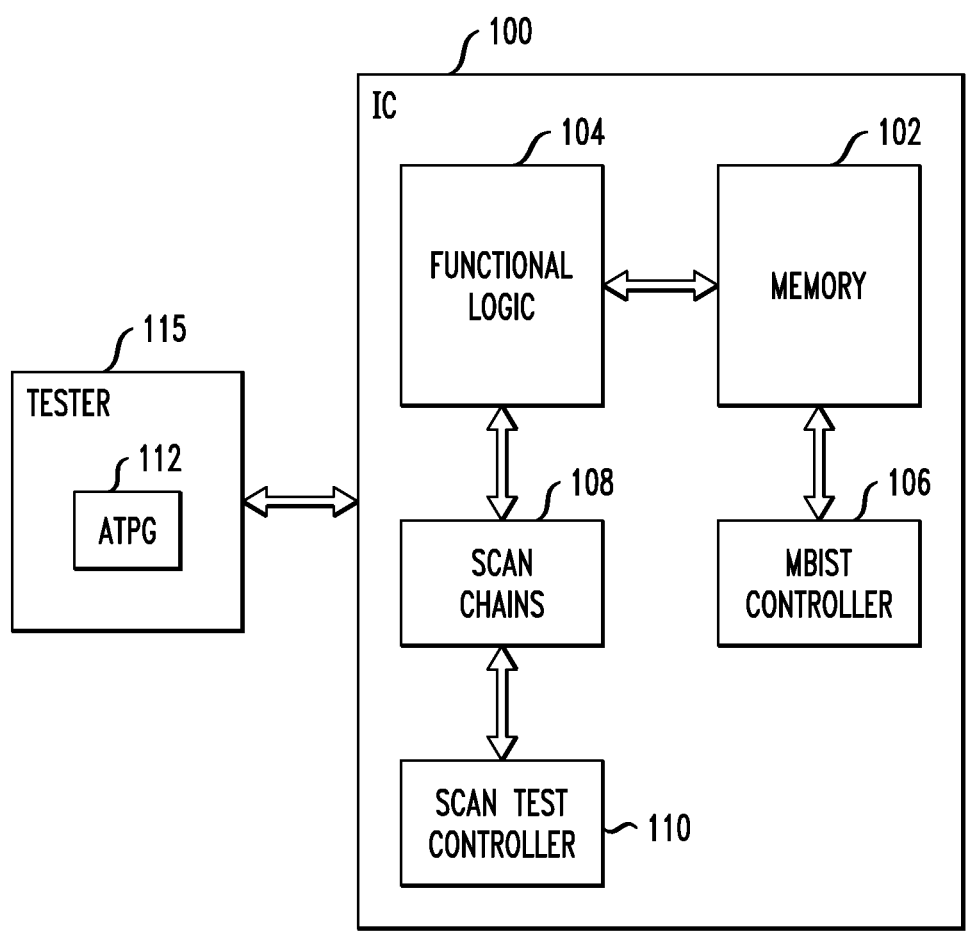
FIG. 1 is a block diagram showing an integrated circuit that incorporates scan test circuitry for at-speed testing of memory-related functional logic in an illustrative embodiment.

FIG. 1 shows an integrated circuit 100 that comprises an embedded memory 102 and associated functional logic 104. An MBIST controller 106 is coupled to embedded memory 102 for performing conventional MBIST testing of the embedded memory. The integrated circuit 100 further comprises scan test circuitry which in this embodiment includes scan chains 108 and a scan test controller 110. This scan test circuitry is advantageously configured to provide at-speed scan testing of functional paths through the memory 102 using a scan capture clock signal having a controllable number of capture pulses. The number of capture pulses of the scan capture clock signal varies in real time depending upon the particular test patterns being applied to the functional logic 104 via scan chains 108, thereby facilitating full coverage of the functional paths not covered by the MBIST testing carried out by MBIST controller 106. Test patterns are applied to the scan chains 108 in the scan test circuitry from an automatic test pattern generator (ATPG) 112 that is associated with a tester 115.

Embodiments of the present invention may be configured to utilize compressed or noncompressed scan testing implemented via the scan test circuitry comprising scan chains 108 and scan test controller 110. Accordingly, scan test circuitry in one or more embodiments may further comprise a decompressor for decompressing compressed scan patterns to be applied to the scan chains, and a compressor for compressing scan chain outputs received from the scan chains. However, such decompressor and compressor elements should not be viewed as requirements of any embodiment of the invention.

It is therefore to be appreciated that the particular configuration of integrated circuit 100 as shown in FIG. 1 is exemplary only, and the integrated circuit in other embodiments may include other elements in addition to or in place of those specifically shown, including one or more elements of a type commonly found in a conventional implementation of such an integrated circuit. For example, various elements of the integrated circuit may be implemented, by way of example and without limitation, utilizing a microprocessor, central processing unit (CPU), digital signal processor (DSP), application-specific integrated circuit (ASIC), field-programmable gate array (FPGA), or other type of data processing device, as well as portions or combinations of these and other devices. Thus, the integrated circuit 100 need not include an embedded memory such as memory 102, and the functional logic 104 in the present embodiment may be replaced with other types of additional circuitry subject to testing utilizing the scan test circuitry 108 and 110 of the integrated circuit 100.

Figure 2:
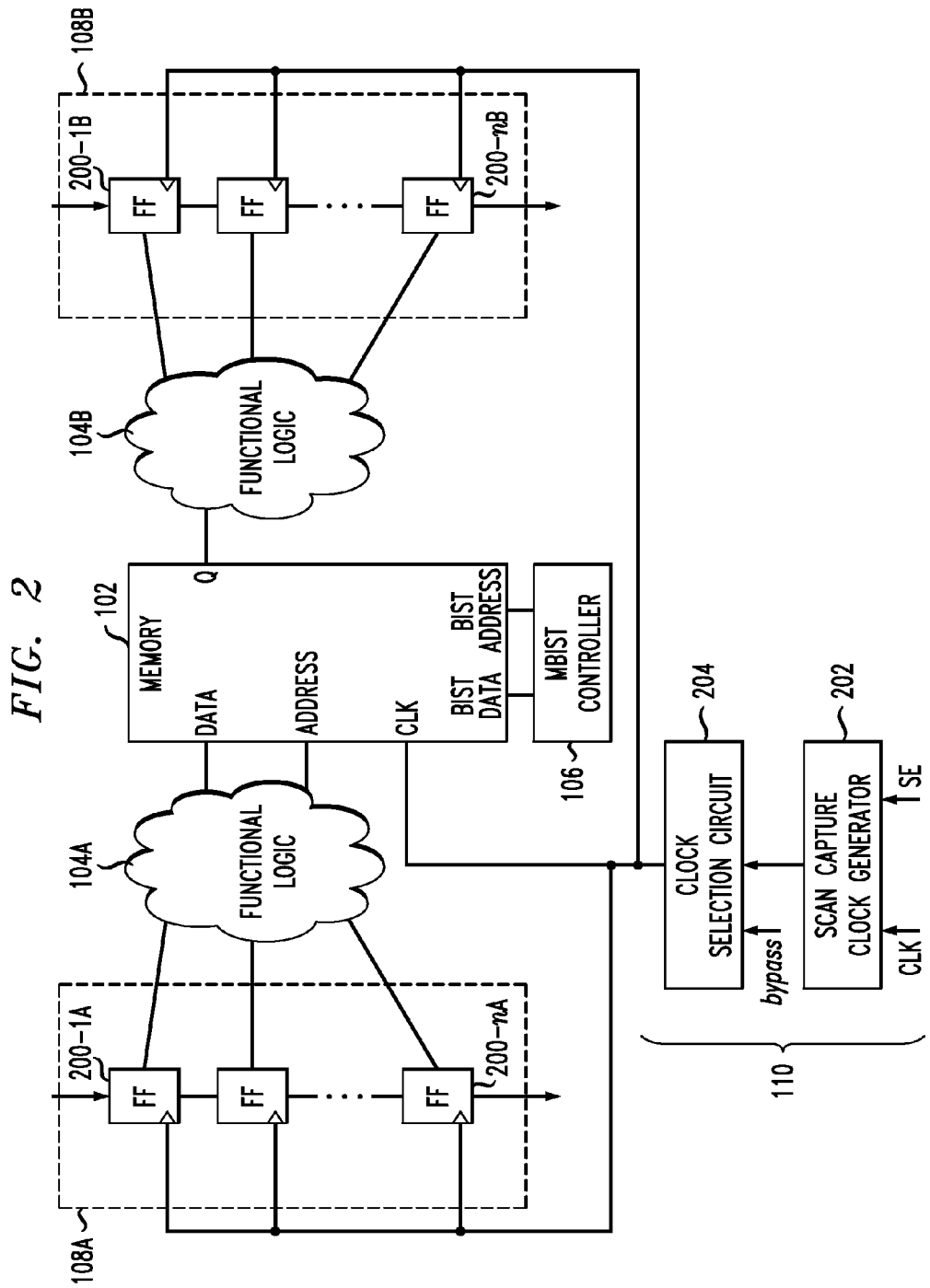
FIG. 2 shows a more detailed view of a portion of the integrated circuit of FIG. 1.

Referring now to FIG. 2, portions of one potential configuration of the integrated circuit 100 are shown in greater detail. As illustrated, the embedded memory 102 has data and address inputs that are driven by functional logic 104A and data outputs (Q) that drive functional logic 104B. The MBIST controller 106 drives BIST data and BIST address ports of the memory 102. The scan chains 108 of the integrated circuit more particularly include at least two chains 108A and 108B, with each chain comprising n scan flip-flops (FFs) that are denoted 200-1 through 200-n. Other embodiments may include more scan chains, and all such chains need not have the same number of flip-flops. Each scan flip-flop generally has a scan input (SI), scan output (SO), functional mode data input (D), functional mode data output (Q), clock input (CLK) and asynchronous reset input (RST).

In this embodiment, the functional logic 104A is arranged between the scan chain 108A and the memory 102, and the functional logic 104B is arranged between the memory 102 and the scan chain 108B. The scan chains 108A and 108B are configurable to operate as respective serial shift registers in a scan shift mode of operation of the integrated circuit 100. In such a mode of operation, scan input data signals corresponding to test patterns from the ATPG 112 are shifted into the serial shift registers, and resulting scan output data signals are shifted out of the serial shift registers and back to the ATPG 112. Accordingly, the scan inputs of the first flip-flops 200-1A and 200-1B in the scan chains 108A and 108B may be coupled to outputs of the ATPG 112 and the scan outputs of the final flip-flops 200-nA and 200-nB in the scan chains 108A and 108B may be coupled to outputs of the ATPG 112, but such connections are not expressly shown in the figure.

The scan chains 108 in the FIG. 2 embodiment are shown without any other intervening elements between the flip-flops 200 of a given chain, but it should be understood that a scan chain may comprise other logic elements such as slave elements, latches, buffers, inverters or other elements arranged between adjacent flip-flops in the chain. The term "scan chain" as used herein is intended to encompass such arrangements.

The clock inputs of the scan flip-flops 200 and the embedded memory 102 are driven by an output of the scan test controller 110. It is assumed that the ATPG 112 also has access to this clock signal, and generates test patterns such that all the faults on the functional paths going into and out of the memory 102 are tested.

The scan chains 108A and 108B are also operative to capture functional data in a functional mode of operation of the integrated circuit 100. The scan chains may therefore also be coupled to respective primary inputs and primary outputs of the integrated circuit. For example, data inputs of the flip-flops of the scan chain 108A may be coupled to primary inputs of the integrated circuit, and data outputs of the flip-flops of the scan chain 108B may be coupled to primary outputs of the integrated circuit, although again these connections are not expressly shown in the figure. Additional details regarding the operation of scan chains in scan shift and functional modes of operation of an integrated circuit may be found in the above-cited U.S. Pat. No. 7,831,876.

As noted above, techniques for MBIST testing of embedded memory in an integrated circuit would typically involve bypassing the functional address and data paths going into the embedded memory, such that no test coverage is provided for input and output circuitry associated with the functional address and data paths.

The scan test controller 110 in the present embodiment is advantageously configured to address this problem by generating a scan capture clock in which the number of capture pulses can be controlled in real time based on test patterns being applied by ATPG 112 to the scan chains 108A and 108B of the integrated circuit 100. The variable number of capture pulses facilitates testing of the functional logic 104A and 104B that is not covered by the MBIST testing implemented using MBIST controller 106. For example, such an arrangement allows the functional logic to be tested using at-speed clocks, such that the test environment closely tracks the functional operating environment. The scan test controller 110 takes into account variations in capture pulse requirements for particular test patterns and generates an appropriate number of at-speed capture pulses in real time.

As shown in FIG. 2, the scan test controller 110 comprises a scan capture clock generator 202 coupled to a clock section circuit 204. The scan capture clock generator 202 is configured to generate a scan capture clock signal having a controllable number of capture pulses, and the clock selection circuit 204 is configured to select between at least the scan capture clock signal and a scan shift clock signal for application to clock signal inputs of the scan chains 108A and 108B. The scan capture clock generator 202 and clock selection circuit 204 are shown in greater detail in FIGS. 3 and 5, respectively.

Figure 3:
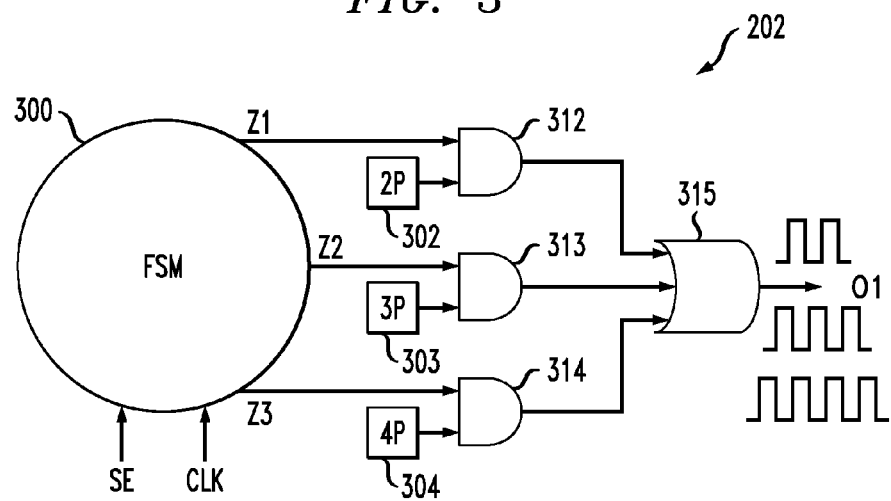
FIG. 3 is a schematic diagram illustrating a scan capture clock generator in the scan test circuitry of the integrated circuit of FIG. 1.

Referring now to FIG. 3, the scan capture clock generator 202 comprises a finite state machine (FSM) 300, and a plurality of capture clock pulse circuits 302, 303 and 304. The capture clock pulse circuits 302, 303 and 304 each generate an at-speed capture clock pulse signal comprising a different number of capture clock pulses, namely, two pulses (2P), three pulses (3P) or four pulses (4P). The scan capture clock generator 202 further comprises logic circuitry that is coupled to the finite state machine 300 and has inputs adapted to receive the outputs of the capture clock pulse circuits 302, 303 and 304. This logic circuitry is configured to pass to its output O1 a particular one of the capture clock pulse signals based on a current state of the finite state machine 300.

The logic circuitry in this embodiment more specifically comprises first, second and third AND gates 312, 313 and 314, each having a first input coupled to an output of the finite state machine 300 and a second input coupled to the output of a corresponding one of the capture clock pulse circuits 302, 303 and 304, and an output OR gate 315. The output OR gate 315 has inputs coupled to respective outputs of the first, second and third AND gates 312, 313 and 314, and an output providing the particular one of the capture clock pulse signals based on the current state of the finite state machine. The output O1 of the OR gate 315 therefore comprises an at-speed scan capture clock having either two capture pulses, three capture pulses or four capture pulses, as illustrated.

Each of the capture clock pulse circuits may be driven by a corresponding trigger signal not explicitly shown in FIG. 3. When this trigger signal transitions from a logic low to a logic high level, a pulse wide enough to pass either two, three or four pulses is generated within the associated capture clock pulse circuit. This pulse may be input into an AND gate with a functional clock of the integrated circuit in order to create the corresponding capture clock pulse signal with two, three or four pulses. As indicated previously, capture clock pulses generated in this manner are at-speed capture clock pulses, in that they have the same clock pulse duration as the functional clock typically applied to functional logic 104 in the functional mode of operation of the integrated circuit 100.

It is generally not known in advance how many capture pulses are needed for the various test patterns that will be generated by the ATPG 112. However, it is assumed in the present embodiment that at most four capture pulses are needed to perform at-speed scan testing of the functional paths through the memory 102. Accordingly, the scan capture clock generator 202 in this embodiment generates at most four capture pulses, with the particular number depending on the test pattern currently being applied to the scan chains 108 in the manner described below. In other embodiments, other numbers of capture pulses may be generated by the scan capture clock generator.

The finite state machine 300 has first and second inputs adapted to receive a shift enable signal SE and a scan shift clock signal CLK, respectively, and generates three outputs denoted Z1, Z2 and Z3 which are applied to inputs of the respective AND gates 312, 313 and 314.

Figure 4:
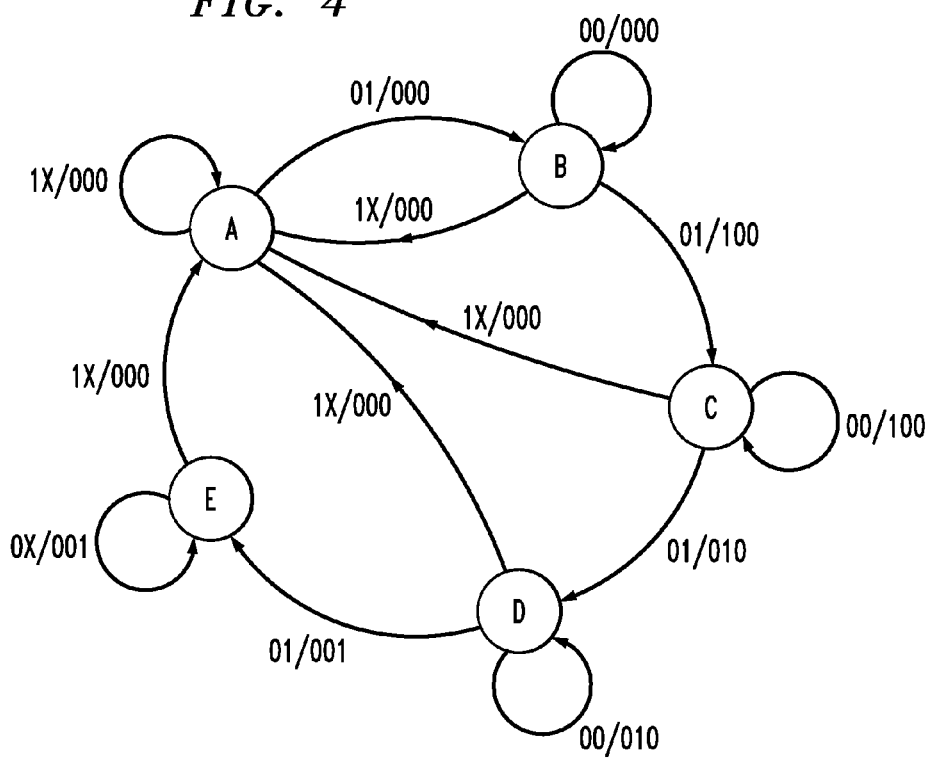
FIG. 4 is a state diagram of a finite state machine in the scan capture clock generator of FIG. 3.

FIG. 4 shows an exemplary state diagram for the finite state machine 300 in the present embodiment. The finite state machine has a plurality of states including a reset state A and four additional states B, C, D and E configured to cause the logic circuitry 312, 313, 314 and 315 to select particular ones of the capture clock pulse signals as a function of the SE and CLK inputs applied to the finite state machine. States C, D and E represent respective two pulse, three pulse and four pulse states. The notation associated with each of the state transitions in the state diagram is ab/cde where a and b are the SE and CLK inputs to the state machine, and c, d and e are the Z1, Z2 and Z3 outputs of the state machine. An entry of X denotes a don't care value. Thus, when SE is at a logic high level, the state machine is in its reset state A, and its output is 000. This is the state when data is being shifted into and out of the scan chains 108 and therefore the scan capture clock signal remains inactive.

In order to move from the reset state A to state B, SE must be at a logic low level. When SE goes to the logic low level, the scan capture clock can be used to capture scan output data from the functional paths through the memory 102 and functional logic 104. From the reset state A, if CLK is pulsed once while SE is at a logic low level, the state machine moves to state B and its output remains at 000, such that no capture clock pulses are generated. From state B, if CLK is pulsed once more while SE is at a logic low level, the state machine moves to state C and its output is 100, which will cause two capture pulses to appear at the output of OR gate 315. From state C, if CLK is pulsed again, the state machine moves to state D and its output is 010, which will cause three capture pulses to appear at the output of OR gate 315. From state D, if CLK is pulsed again, the state machine moves to state E and its output is 001, which will cause four capture pulses to appear at the output of OR gate 315. Thus, at any given time, only one of the sets of two, three or four capture pulses will appear at the output of OR gate 315.

Within each of the states B, C and D, the absence of an additional pulse of CLK will cause the state machine to remain within that state and to maintain the respective output values of 000, 100 and 010 at Z1, Z2 and Z3. Also, within state E, additional pulses of CLK will not cause the state machine to move from that state, and so the corresponding output values of 001 at Z1, Z2 and Z3 are maintained. From each of the states B, C, D and E, assertion of SE causes the state machine to return to the reset state A and to output 000 such that no capture clock pulses appear at the output of OR gate 315.

It should be noted that the use of two, three or four capture clock pulses in the present embodiment is by way of example only, and other embodiments may use different numbers of controllable capture clock pulses. For example, embodiments of the invention may be configured to support more than four capture clock pulses.

The number of times CLK is pulsed will generally depend upon the particular test pattern currently being applied by the ATPG 112. Thus, the finite state machine 300 and the other elements of the scan capture clock generator 202 are configured such that depending upon the current test pattern and the number of times CLK is pulsed, that many at-speed scan capture pulses will be produced at the output of the OR gate 315.

Figure 5:
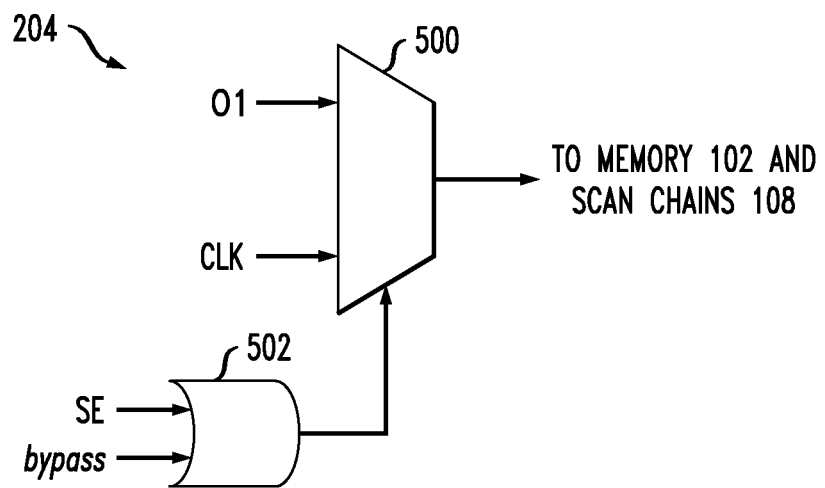
FIG. 5 is a schematic diagram illustrating a clock selection circuit in the scan test circuitry of the integrated circuit of FIG. 1.

As noted above, the clock selection circuit 204 is shown in greater detail in FIG. 5. The clock selection circuit 204 as illustrated in this figure comprises a multiplexer 500 having a first input adapted to receive the O1 output of the scan capture clock generator 202 and a second input adapted to receive the scan shift clock CLK. The clock selection circuit 204 further comprises an OR gate 502 having a first input adapted to receive the shift enable signal SE and a second input adapted to receive an additional signal denoted bypass. The output of the OR gate 502 drives the select line of the multiplexer 500.

When scan data is being shifted into and out of the scan chains 108 in a scan shift mode of operation, SE is at a logic high level and the multiplexer 500 passes the scan shift clock CLK to its output. During a functional mode of operation in which the scan chains 108 are used to capture functional data, SE is at a logic low level, and the output O1 from the OR gate 315 is passed to the output of the multiplexer 500.

Test patterns may be generated by the ATPG 112 initially assuming that the scan shift clock CLK will be used for both scan shift and data capture. Accordingly, when the test patterns are being generated, the bypass signal is set to a logic high level, such that the scan capture clock CLK is selected by the multiplexer 500 regardless of the logic level of the shift enable signal SE. During testing using the generated test patterns, the bypass signal is set to a logic low level, such that the multiplexer 500 selects either the scan shift clock CLK or the output O1 of OR gate 315 depending upon the logic level of the shift enable signal SE.

During data captures, both bypass and SE are at logic low levels, and the output of OR gate 315 provides the appropriate number of capture pulses in the manner previously described. This may be facilitated by adjusting the scan test timing to add a certain number of cycles prior to start of scan shift for a given test pattern. In these cycles, a sequence such as 0→1→0→0 may be applied on the above-noted trigger inputs of the capture pulse generator circuits 302, 303 and 304 while keeping the scan capture clock CLK at a logic low level. The finite state machine 300 will be in a state in which one of Z1, Z2 or Z3 is at a logic high level depending upon the number of times CLK was pulsed by the ATPG 112 during scan capture. Following the application of this trigger sequence, the output O1 of OR gate 315 and hence the output of the multiplexer 500 will produce the appropriate number of functional capture clock pulses for the given test pattern. As a result, the scan circuitry shown in FIGS. 3, 4 and 5 is operative to replace relatively slow scan shift clock pulses with at-speed clock pulses for scan captures.

It should be understood that the particular circuitry, signals, states and other features of the illustrative arrangement of FIGS. 2 through 5 are presented by way of example only, and other features may be used in alternative embodiments. For example, as noted above, different numbers of controllable capture pulses may be generated in other embodiments, and the signaling used to provide an appropriate number of at-speed capture pulses to the scan chains 108 relative to an associated scan shift clock may be varied depending upon the needs of a particular application. Also, in alternative embodiments portions of the scan test circuitry in the FIG. 1 embodiment may be implemented off-chip, such as in an associated tester of an integrated circuit testing system.

Figure 6:
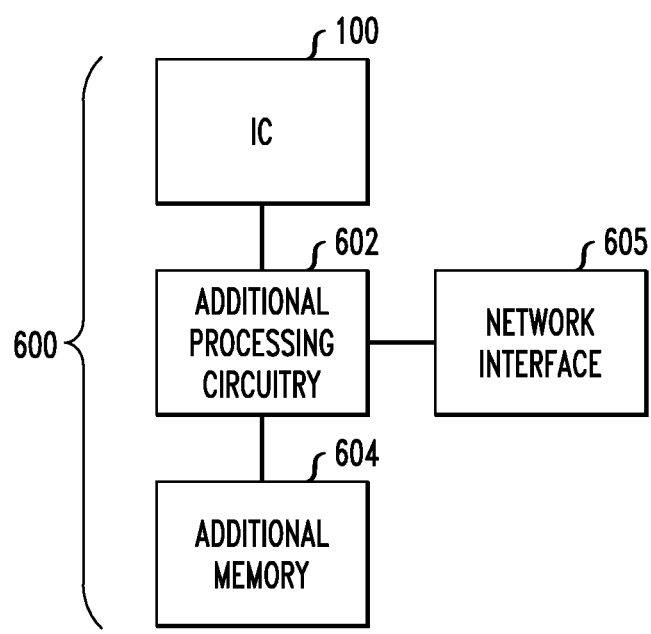
FIG. 6 is a block diagram of an exemplary processing device that incorporates the integrated circuit of FIG. 1.

The integrated circuit 100 may be incorporated into a computer, server, communication device or other type of processing device. An example of such a processing device is the processing device 600 shown in FIG. 6. This processing device includes, in addition to integrated circuit 100, processing circuitry 602 and memory 604. The processing circuitry 602 of processing device 600 may comprise a microprocessor, CPU, ASIC, FPGA or other type of processing device, as well as portions or combinations of such devices. The processing circuitry 602 is coupled to the memory 604 and to a network interface 605. The network interface 605 permits the processing system 600 to communicate with other systems and devices over one or more networks, and may therefore comprise, by way of example, one or more conventional transceivers.

The integrated circuit 100 may incorporate and execute software for controlling scan test functionality of the type described herein. Such software may be stored in a memory of the integrated circuit itself, or in additional memory 604 of associated processing device 600. These and other memories used to store software may each be viewed as an example of what is more generally referred to herein as a computer-readable medium or other type of computer program product having computer program code embodied therein, and may comprise, for example, electronic memory such as RAM or ROM, multi-level memory, magnetic memory, optical memory, or other types of storage devices in any combination.

Illustrative embodiments as disclosed herein provide significant improvements in scan testing of integrated circuits, with or without the use of scan compression. For example, in one or more such embodiments, functional address and data paths of an embedded memory of an integrated circuit can be tested using a controllable number of at-speed capture pulses appropriate to the particular test patterns being applied.

As indicated above, embodiments of the present invention may be implemented in the form of one or more integrated circuits. In a given such integrated circuit implementation, identical die are typically formed in a repeated pattern on a surface of a semiconductor wafer. Each die includes scan test circuitry as described herein, and may include other structures or circuits. The individual die are cut or diced from the wafer, then packaged as an integrated circuit. One skilled in the art would know how to dice wafers and package die to produce integrated circuits. Integrated circuits so manufactured are considered part of this invention.

Again, it should be emphasized that the embodiments of the invention as described herein are intended to be illustrative only. For example, the invention can be implemented using a wide variety of other types of scan test circuitry, using different arrangements of logic gates, state machines, clocks and other signals, than those previously described in conjunction with the illustrative embodiments. These and numerous other alternative embodiments within the scope of the following claims will be readily apparent to those skilled in the art.

What is claimed is:

1. An integrated circuit comprising:
   scan test circuitry; and
   additional circuitry subject to testing utilizing the scan test circuitry;
   the scan test circuitry comprising:
      a plurality of scan chains coupled to the additional circuitry;
      a scan capture clock generator configured to generate a scan capture clock signal having a controllable number of capture pulses; and
      a clock selection circuit configured to select between at least the scan capture clock signal and a scan shift clock signal for application to clock signal inputs of the scan chains;
   wherein the scan capture clock generator comprises a plurality of capture clock pulse circuits each generating a capture clock pulse signal comprising a different number of capture clock pulses, the scan capture clock generator being configured to provide at an output thereof at least a portion of a particular one of the capture clock pulse signals as the scan capture clock signal.

2. The integrated circuit of claim 1 wherein the additional circuitry comprises functional logic associated with an embedded memory of the integrated circuit.

3. The integrated circuit of claim 1 wherein the scan capture clock generator further comprises:
   a finite state machine; and
   logic circuitry coupled to the finite state machine and having inputs adapted to receive outputs of the capture clock pulse circuits, the logic circuitry being configured to provide at an output thereof at least a portion of the particular one of the capture clock pulse signals based on a current state of the finite state machine.

4. The integrated circuit of claim 3 wherein the finite state machine has a plurality of states including a reset state and additional states configured to cause the logic circuitry to select particular ones of the capture clock pulse signals as a function of inputs applied to the finite state machine.

5. The integrated circuit of claim 3 wherein the finite state machine has at least first and second inputs adapted to receive a shift enable signal and the scan shift clock signal, respectively.

6. The integrated circuit of claim 1 wherein the plurality of capture clock pulse circuits comprises at least:
a first capture clock pulse circuit generating a capture clock pulse signal having two capture clock pulses; and
a second capture clock pulse circuit generating a capture clock pulse signal having three capture clock pulses.

7. The integrated circuit of claim 6 wherein the plurality of capture clock pulse circuits further comprises a third capture clock pulse circuit generating a capture clock pulse signal having four capture clock pulses.

8. The integrated circuit of claim 1 wherein the logic circuitry comprises:
first, second and third logic gates each having a first input coupled to an output of the finite state machine and a second input coupled to the output of a corresponding one of the capture clock pulse circuits; and
an output logic gate having inputs coupled to respective outputs of the first, second and third logic gates and an output providing the particular one of the capture clock pulse signals based on the current state of the finite state machine.

9. The integrated circuit of claim 1 wherein the clock selection circuit comprises:
a multiplexer having a first input adapted to receive the scan capture clock signal and a second input adapted to receive the scan shift clock signal; and
a logic gate having a first input adapted to receive a shift enable signal and a second input adapted to receive a bypass signal;
wherein an output of the logic gate is coupled to a select line of the multiplexer.

10. The integrated circuit of claim 9 wherein the integrated circuit is configured to receive test patterns from a test pattern generator and further wherein in conjunction with a given test pattern being generated by the test pattern generator for application to the additional circuitry the bypass signal is set to a first logic level that ensures that the scan shift clock is selected by the multiplexer regardless of the logic level of the shift enable signal.

11. The integrated circuit of claim 10 wherein in conjunction with testing of the additional circuitry using the generated test pattern, the bypass signal is set to a second logic level that allows the multiplexer to select either the scan capture clock signal or the scan shift clock signal depending on the logic level of the shift enable signal.

12. A processing device comprising the integrated circuit of claim 1.

13. A method of scan testing an integrated circuit, comprising: generating a scan capture clock signal having a controllable number of capture pulses; and selecting between at least the scan capture clock signal and a scan shift clock signal for application to clock signal inputs of scan chains of the integrated circuit; wherein generating a scan capture clock signal comprises generating a plurality of capture clock pulse signals each comprising a different number of capture clock pulses and selecting a particular one of the capture clock pulse signals as the scan capture clock signal.

14. The method of claim 13 wherein generating a scan capture clock signal further comprises providing a finite state machine and wherein selecting the particular one of the capture clock pulse signals is based on a current state of the finite state machine.

15. The method of claim 14 wherein the finite state machine has a plurality of states including a reset state and additional states configured to control said selecting of a particular one of the capture clock pulse signals as a function of inputs applied to the finite state machine.

16. The method of claim 14 wherein the finite state machine has at least first and second inputs adapted to receive a shift enable signal and the scan shift clock signal, respectively.

17. The method of claim 13 wherein generating a scan capture clock signal comprises:
generating a first capture clock pulse signal having two capture clock pulses;
generating a second capture clock pulse signal having three capture clock pulses;
generating a third capture clock pulse signal having four capture clock pulses; and
selecting one of the first, second and third capture clock pulse signals as the scan capture clock signal.

18. The method of claim 13 wherein selecting between at least the scan capture clock signal and the scan shift clock signal for application to clock signal inputs of scan chains of the integrated circuit comprises selecting as a function of both a shift enable signal and a bypass signal.

19. The method of claim 18 further comprising the step of generating a test pattern for application to circuitry of the integrated circuit, wherein in conjunction with said test pattern being generated the bypass signal is set to a first logic level that ensures that the scan shift clock is selected regardless of the logic level of the shift enable signal, and further wherein in conjunction with testing of the circuitry using the generated test pattern, the bypass signal is set to a second logic level that allows either the scan capture clock signal or the scan shift clock signal to be selected depending on the logic level of the shift enable signal.

20. A computer program product comprising a non-transitory computer-readable storage medium having computer program code embodied therein for use in scan testing an integrated circuit, wherein the computer program code when executed causes the integrated circuit to perform the steps generating a scan capture clock signal having a controllable number of capture pulses; and selecting between at least the scan capture clock signal and a scan shift clock signal for application to clock signal inputs of scan chains of the integrated circuit; wherein generating a scan capture clock signal comprises generating a plurality of capture clock pulse signals each comprising a different number of capture clock pulses and selecting a particular one of the capture clock pulse signals as the scan capture clock signal.

* * * * *